US012785659B2

(12) United States Patent
Yu et al.

(10) Patent No.: US 12,785,659 B2
(45) Date of Patent: Nov. 3, 2026

(54) ACOUSTIC WAVE ELEMENT HAVING REFLECTORS PROVIDING CAPACITANCE

(71) Applicant: PENTASTONE ELECTRONICS, INC, Seongnam-si (KR)

(72) Inventors: Dae Kyu Yu, Seoul (KR); Kyoung Joon Min, Seongnam-si (KR); Kyung Oh Kim, Seoul (KR); Jung Geun Shin, Ansan-si (KR)

(73) Assignee: PENTASTONE ELECTRONICS, INC, Seongnam-si (KR)

( * ) Notice: Subject to any disclaimer, the term of this patent is extended or adjusted under 35 U.S.C. 154(b) by 56 days.

(21) Appl. No.: 18/956,004

(22) Filed: Nov. 22, 2024

(65) Prior Publication Data

US 2025/0175152 A1 May 29, 2025

(30) Foreign Application Priority Data

Nov. 23, 2023 (KR) ........................ 10-2023-0164316

(51) Int. Cl.
*H03H 9/25* (2006.01)
*H03H 9/64* (2006.01)

(52) U.S. Cl.
CPC ............ *H03H 9/25* (2013.01); *H03H 9/6406* (2013.01)

(58) Field of Classification Search
CPC ............................... H03H 9/25; H03H 9/6406
See application file for complete search history.

(56) References Cited

U.S. PATENT DOCUMENTS

| | | | |
|---|---|---|---|
| 5,932,950 | A | 8/1999 | Yamada et al. |
| 10,193,529 | B2 | 1/2019 | Komura |

FOREIGN PATENT DOCUMENTS

| | | | | | |
|---|---|---|---|---|---|
| JP | 2001-237668 | A | | 8/2001 | |
| JP | 3487772 | B2 | | 1/2004 | |
| JP | 2006186487 | A | * | 7/2006 | |
| JP | 2006254496 | A | * | 9/2006 | |
| JP | 3963862 | B2 | | 8/2007 | |
| JP | 2010187057 | A | * | 8/2010 | ......... H03H 9/02645 |
| JP | 2011-130513 | A | | 6/2011 | |
| JP | 2014143675 | A | * | 8/2014 | ........... H03H 9/0576 |
| JP | 2017076903 | A | * | 4/2017 | |
| KR | 102839899 | B1 | * | 7/2025 | ............... H03H 9/64 |
| WO | WO-2024128020 | A1 | * | 6/2024 | ............. H03H 9/145 |

OTHER PUBLICATIONS

Minsang Seong, Jungsun Kim, Yungseon Eo, SAW device with reactive reflector for integrated SAW RF duplexer area minimization, Oct. 10, 2024, IEEE Transaction or electron devices, vol. 71, pp. 6312-6319. (Year: 2024).*

* cited by examiner

*Primary Examiner* — Andrea Lindgren Baltzell
*Assistant Examiner* — Kimberly E Glenn
(74) *Attorney, Agent, or Firm* — Revolution IP, PLLC

(57) ABSTRACT

An acoustic wave element having reflectors providing capacitance according to the present invention further improves skirt characteristics of the acoustic wave element steeply by configuring the reflector structure of the acoustic wave element such as a SAW resonator, a composite resonator, and DMS as a capacitive reflector structure so that the parallel resonance frequency can be shifted toward the series resonance frequency without additional capacitors connected to the acoustic wave element while maintaining the area.

8 Claims, 11 Drawing Sheets

ACOUSTIC WAVE ELEMENT HAVING REFLECTORS PROVIDING CAPACITANCE

CROSS-REFERENCE TO RELATED APPLICATIONS

This application claims the benefit of priority under 35 U.S.C. § 119(a) to Korean Patent Application No. 10-2023-0164316, filed on Nov. 23, 2023, the entire contents of which are incorporated herein by reference.

ACKNOWLEDGEMENT

National R&D project supporting this invention
[Assignment No.] 2021-0-00163
[Name of department] Ministry of Science and ICT
[Research and management institution] Information and Communication Planning and Evaluation Institute
[Research project name] Broadcasting and Communication Industrial Technology Development Project
[Research Project Title] Development of high-efficiency RF FEM for Wi-Fi 6/6e AP
[Contribution rate] 1/1
[Supervised Research Institution] WiPAM, Inc.
[Research period] 3rd year (2023 Jan. 1~2023 Dec. 31)

BACKGROUND OF THE INVENTION

Field of the Invention

The present invention relates to an acoustic wave element having reflectors providing capacitance for improving skirt characteristics of a bandpass filter. Specifically, the present invention relates to an acoustic wave element with a capacitive reflector structure by implementing a capacitor function to move a parallel resonance frequency toward a series resonance frequency in the acoustic wave element used in a resonator or a filter that converts an electrical signal into an acoustic wave of a piezoelectric material using a piezoelectric effect of the piezoelectric material and converts the converted acoustic wave back into an electrical signal.

Description of the Related Art

According to developments of a mobile communication device such as a smartphone and a tablet PC, high performance is required for acoustic wave devices and devices such as SAW resonators and filters used therefor.

In particular, with the advent of the 5G era, as frequencies available in the mobile environment increase, the number of acoustic wave filters in the mobile phone has increased significantly. Accordingly, since more filters and RF devices must be added to a limited space, miniaturization and integration of filter sizes are urgently required.

As a considerable number of elements are added to such the limited space, mutual interference between frequencies generated by each element needs to be minimized. For this, the steep skirt characteristics on the response curve of the surface acoustic wave filter (SAW Filter) become more important.

FIG. 1 shows a structure of a conventional SAW resonator. Such a conventional SAW resonator has an Inter-Digital Transducer, that is IDT structure 20, configured by continuously arranging metal electrodes in parallel on a piezoelectric substrate 10 made of a piezo-electric material. When an AC signal voltage is applied to the IDT 20, an electric field is generated between metal electrodes inside the IDT, and a surface of the piezoelectric substrate 10 is deformed by the Piezo-electric Effect, and a surface acoustic wave (SAW) propagates in both directions of the IDT.

In this way, the surface acoustic wave generated on the surface of the piezoelectric substrate 10 by the IDT 20 is converted back into an electric signal by output electrodes in the IDT or another IDT disposed adjacent to it. As described above, the SAW resonator or filter may function as a band pass filter that passes a frequency component that is synchronized with the frequency of the surface acoustic wave and attenuates the remaining component signal in the process of converting the surface acoustic wave back into an electric signal.

Wherein the SAW resonator or filter can reduce the loss of waves by reflecting the surface acoustic wave generated by the IDT 20 and propagated outside to the IDT 20 again by having reflectors 30 and 40 composed of gratings formed of metal thin films around the IDT 20 on the piezoelectric substrate 10.

The reflectors of a typical SAW resonator reflect the surface acoustic wave generated from the IDT according to Bragg condition at both ends of the IDT, trapping the surface acoustic wave inside the SAW resonator.

Meanwhile, FIG. 2 shows a response curve of a basic passband filter (FL) having a parallel SAW resonator (SAW (P)) connected in parallel and a series SAW resonator (SAW(S)) connected in series, as described above.

FIG. 2 shows the frequency-to-admittance curve ($Y_{11S}$) of the series SAW resonator (SAW(S)) of the filter FL, the frequency-to-admittance curve ($Y_{11P}$) of the parallel SAW resonator (SAW (P)) of the filter FL, and the frequency-to-insertion loss curve ($S_{21}$) of the filter FL having the series SAW resonator (SAW(S)) and the parallel SAW resonator (SAW (P)).

Reference character $f_{S,S}$ and fps on the $Y_{P,S}$ curve and $Y_{11P}$ curve are series resonance frequencies, and reference character $f_{S,P}$ and $f_{P,P}$ on the $Y_{11S}$ curve and Yup curve are parallel resonance frequencies.

As shown in FIG. 2, skirt characteristics (sk) in a stop band on the response curve of the filter are closely related to the series resonance frequency and parallel resonance frequency of the SAW resonator constituting the filter.

That is, as shown in FIG. 2, in order to improve the skirt characteristics of the SAW passband filter more steeply, the SAW resonator's parallel resonance frequency ($f_{S,P}$) must be moved toward the series resonance frequency ($f_{S,S}$) to reduce the difference between the parallel resonance frequency and the series resonance frequency.

To this end, conventionally, IDT capacitors or passive capacitors were connected in parallel to the SAW resonator to shift the parallel resonant frequency of the SAW resonator toward the series resonant frequency.

However, this method has a problem that the area of the SAW resonator and filter increases the additionally attached capacitor and the connection line for connecting the capacitor. This problem may act as a fatal obstacle that makes it difficult to make the 5G front-end module thin and compact.

Prior Art Documents related to the present invention are JP 3487772, JP 2011-130513, JP 3963862, JP 2001-237668, U.S. Pat. Nos. 10,193,529, 5,932,950, etc.

SUMMARY OF THE INVENTION

It is an object of the present invention to provide an acoustic wave element having reflectors providing capacitance that can further improve the skirt characteristics of the acoustic wave element steeply by configuring the reflector structure of the acoustic wave element such as a SAW resonator, a composite resonator, and DMS as a capacitive reflector structure so that the parallel resonance frequency can be shifted toward the series resonance frequency without additional capacitors connected to the acoustic wave element while maintaining the area.

An acoustic wave element providing a reflector having a capacitance function according to an embodiment of the present invention includes a piezoelectric substrate; an IDT electrode provided on the piezoelectric substrate to convert electric signals into acoustic waves on the piezoelectric substrate and convert the acoustic waves into electric signals; and a slit reflector that is placed in the propagation direction of the acoustic wave generated from the IDT electrode to reflect the acoustic wave to the IDT electrode, and forms slit capacitance, a slit structure that functions as capacitance.

The slit reflector includes a plurality of divided reflection units each of which reflects the acoustic wave generated by the IDT electrode to the IDT electrode, and at least one slit, wherein the plurality of the divided reflection units are arranged in parallel in a direction perpendicular to the propagation direction of the acoustic wave generated by the IDT electrode, the at least one slit is formed by being spaced apart from each of the plurality of divided reflection units, and the slit is configured to function as the slit capacitance by connecting power to one divided reflection unit and the other divided reflection unit of the slit, respectively. The slit reflector is configured so that a width of the slit formed between each of the plurality of the divided reflection units is shorter than a wavelength of the acoustic wave generated from the IDT electrode.

The slit reflector has an adjusted capacitance value of the slit capacitance by adjusting a length of the slit formed by the plurality of divided reflection units and the number of the slit.

Each of the plurality of divided reflection units is configured to form a closed shape by arranging a plurality of reflecting electrodes having a length shorter than a length of IDT fingers of the IDT electrode at predetermined intervals along the propagation direction of the acoustic wave generated by the IDT electrode.

Meanwhile, the acoustic wave element according to an embodiment of the present invention further includes a plurality of floating reflectors provided between the IDT electrode and the slit reflector without a power connection to reflect the acoustic waves propagating from the IDT electrode in front of the slit reflector, wherein each of the plurality of floating reflectors is disposed at predetermined intervals along the propagation direction of the acoustic wave generated by the IDT electrode.

The acoustic wave element according to an embodiment of the present invention further includes a plurality of floating reflectors provided behind the slit reflector without a power connection to reflect the acoustic waves propagating from the IDT electrode in front of the slit reflector, wherein each of the plurality of floating reflectors is disposed at predetermined intervals along the propagation direction of the acoustic wave generated by the IDT electrode. Each of the plurality of divided reflection units of the slit reflector is configured to form a closed shape by arranging a plurality of reflecting electrodes with a length shorter than a length of IDT finger of the IDT electrode at predetermined intervals along the propagation direction of the acoustic wave generated by the IDT electrode, wherein each of the plurality of floating reflectors is configured to have the same length as the length from the upper end to the lower end of the IDT electrode.

The IDT electrode includes an input IDT electrode unit having a plurality of input IDT fingers and an output IDT electrode unit having a plurality of output IDT fingers, wherein the slit reflector includes: a plurality of divided reflection units arranged in parallel in a direction perpendicular to the propagation direction of the acoustic wave generated by the IDT electrode; at least one slit provided between the divided reflection units; an input-side connection unit connecting the input part of a power source to the input IDT electrode unit and the divided reflection unit on one side of the slit, respectively; and an output-side connection unit connecting the output part of the power source to the output IDT electrode unit and the divided reflection unit on the other side of the slit, respectively.

The slit reflector includes: a first divided reflection unit, a second divided reflection unit, and a third divided reflection unit arranged in parallel in a direction perpendicular to the propagation direction of the acoustic wave generated by the IDT electrode; a first slit with a width smaller than a wavelength of the acoustic wave between the first divided reflection unit and the second divided reflection unit; and a second slit with a width smaller than the wavelength of the acoustic wave between the second divided reflection unit and the third divided reflection unit, wherein the slit capacitance includes a capacitance by the first slit between the first divided reflection unit and the second divided reflection unit, and a capacitance by the second slit between the second divided reflection unit and the third divided reflection unit, by connecting an input part of a power source to the first divided reflection unit, and the third divided reflection unit and an output part of the power source to the second divided reflection unit.

The slit reflector includes: a first divided reflection unit, a second divided reflection unit, a third divided reflection unit and a forth divided reflection unit arranged in parallel in a direction perpendicular to the propagation direction of the acoustic wave generated by the IDT electrode; a first slit with a width smaller than a wavelength of the acoustic wave between the first divided reflection unit and the second divided reflection unit; a second slit with a width smaller than the wavelength of the acoustic wave between the second divided reflection unit and the third divided reflection unit; a third slit with a width smaller than the wavelength of the acoustic wave between the third divided reflection unit and the forth divided reflection unit, wherein the slit capacitance includes a capacitance by the first slit between the first divided reflection unit and the second divided reflection unit, a capacitance by the second slit between the second divided reflection unit and the third divided reflection unit, and a capacitance by the third slit between the third divided reflection unit and the forth divided reflection unit, by connecting an input part of a power source to the first divided reflection unit and the third divided reflection unit, and an output part of the power source to the second divided reflection unit and the forth divided reflection unit.

DETAILED DESCRIPTION OF THE INVENTION

The terms used in the present specification will be briefly described, and the present invention will be described in detail.

Terms used in the present invention have selected general terms currently widely used as possible while taking functions in the present invention into consideration, but this may vary depending on the intention or precedent of a technician engaged in the relevant field, the emergence of new technologies, and the like. In addition, in certain cases, there are terms arbitrarily selected by the applicant, and in this case, the meaning of the terms will be described in detail in the description of the corresponding invention. Therefore, the terms used in the present invention should be defined based on the meaning of the term and the overall contents of the present invention, not a simple name of the term.

When a part of the specification is said to "include" a certain element, it means that other elements may be further included rather than excluding other elements unless specifically stated to the contrary. In addition, terms such as "unit" and "module" described in the specification mean units that process at least one function or operation, which may be implemented as hardware or software, or as a combination of hardware and software.

With the evolution of the mobile communication standard generation, more frequency bands should be supported, but to meet the needs of miniaturization, it is necessary to have steep skirt characteristics on a response curve of a filter without increasing an area of an acoustic wave element.

To meet these conditions, the acoustic wave element according to an embodiment of the present invention implements reflectors on both sides of an IDT electrode on a piezoelectric substrate into a capacitive reflector structure to shift a parallel resonance frequency toward a series resonance frequency to further improve skirt characteristics.

The features of the present invention may be applied to acoustic wave elements including SAW resonators, composite resonators, or DMS (Double Mode SAW) using surface acoustic waves on the piezoelectric substrate, and the following description is given as an example of a case where the features of the present invention are applied to a SAW resonator, but the present invention is not limited thereto and can be applied to all acoustic wave elements in the same manner.

As an example of a capacitive reflector structure provided in an acoustic wave element according to an embodiment of the present invention, FIGS. 3 to 6 show a SAW resonator having a slit reflector implementing one or more slit capacitance therein.

Figure 3:
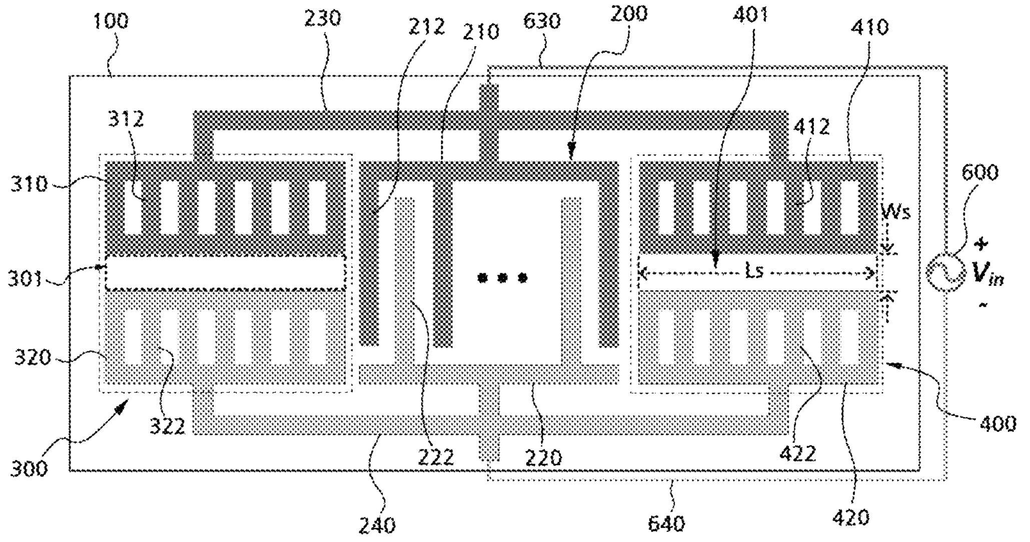
FIG. 3 shows a configuration in which a slit reflector having one slit is provided in a SAW resonator as an example of an acoustic wave element according to an embodiment of the present invention.
Figure 4A:
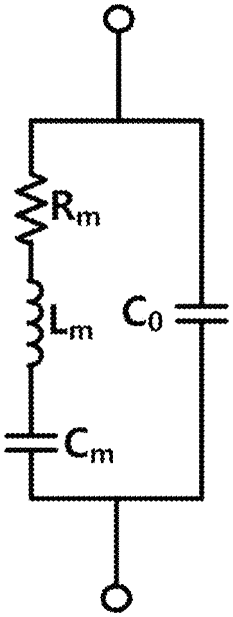
FIG. 4A shows an equivalent circuit model of a conventional SAW resonator.
Figure 4B:
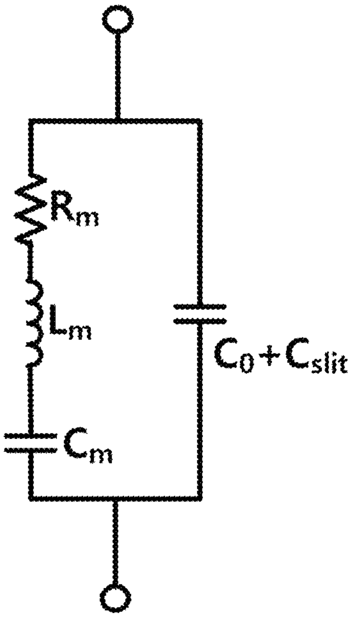
FIG. 4B shows an equivalent circuit model of a SAW resonator according to an embodiment of the present invention.
Figure 5:
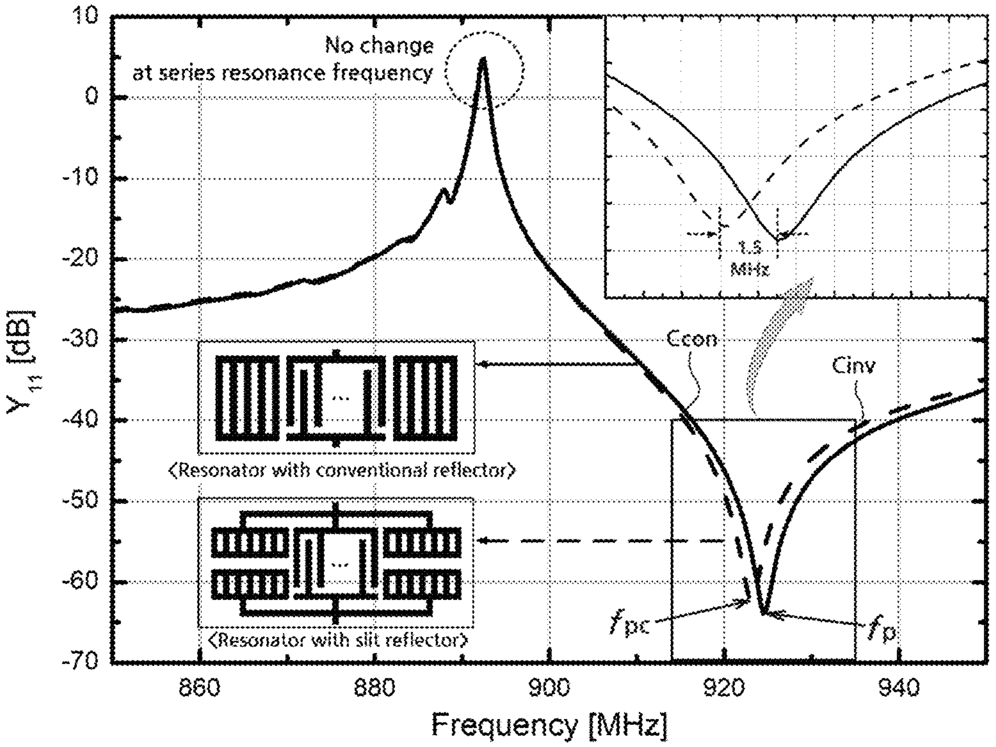
FIG. 5 shows admittance response curves of a conventional SAW resonator and a SAW resonator according to an embodiment of the present invention.

FIG. 3 shows a configuration in which a slit reflector having 1 slit is provided in a SAW resonator as an example of an acoustic wave element according to an embodiment of the present invention. FIGS. 4A and 4B show equivalent circuit models of a conventional SAW resonator and a SAW resonator according to an embodiment of the present invention, respectively. FIG. 5 shows admittance response curves of a conventional SAW resonator and a SAW resonator according to an embodiment of the present invention.

Figure 6:
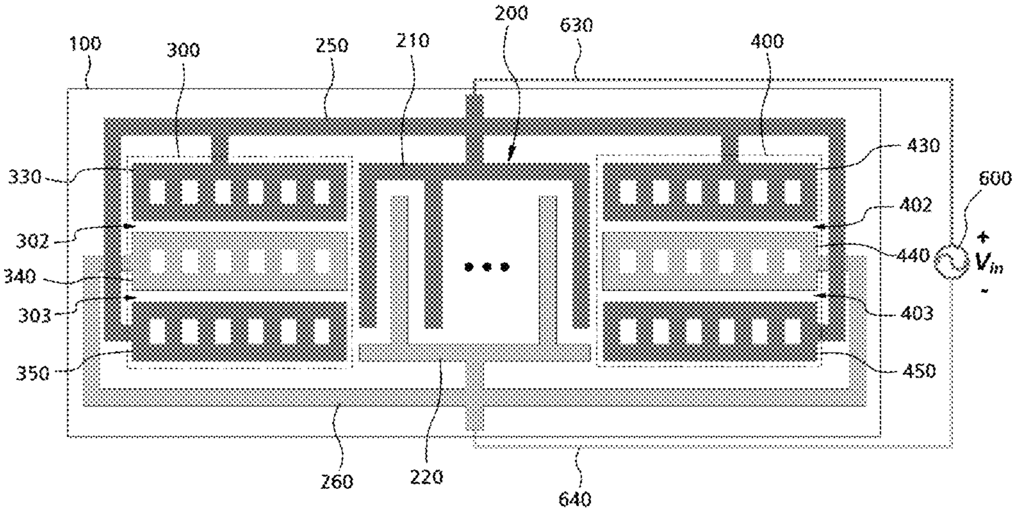
FIG. 6 shows a configuration in which a slit reflector having two slits is provided in a SAW resonator as an example of an acoustic wave element according to another embodiment of the present invention.
Figure 7:
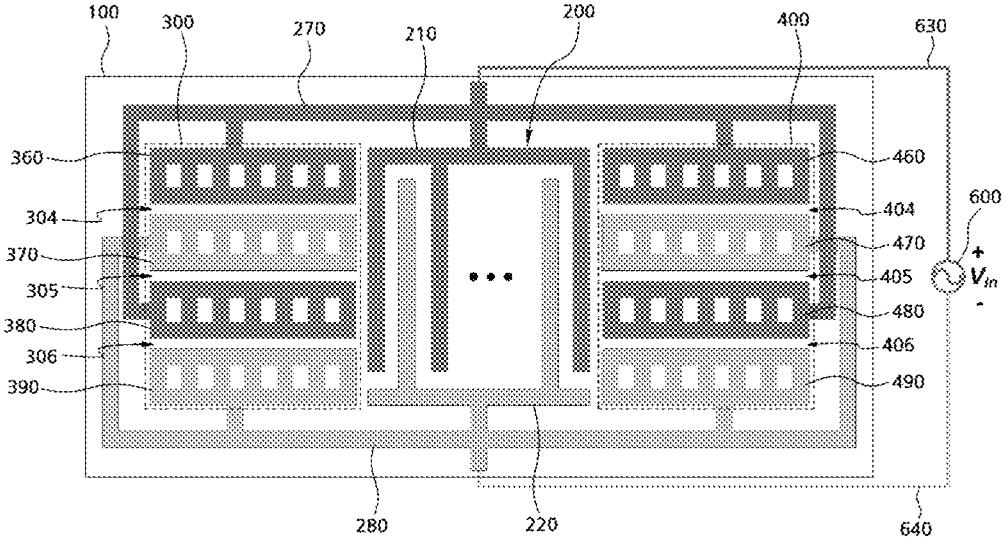
FIG. 7 shows a configuration in which a slit reflector having three slits is provided in a SAW resonator as an example of an acoustic wave element according to another embodiment of the present invention.

FIG. 6 shows a configuration in which a slit reflector having 2 slits is provided in a SAW resonator as an example of an acoustic wave element according to another embodiment of the present invention. FIG. 7 shows a configuration in which a slit reflector having 3 slits is provided in a SAW resonator as an example of an acoustic wave element according to another embodiment of the present invention.

As shown in FIG. 3, the SAW resonator, which is an example of the acoustic wave element according to an embodiment of the present invention, includes a piezoelectric substrate 100 made of a material with piezoelectric effects, and an IDT electrode 200 provided on the piezoelectric substrate 100 to convert electric signals into surface acoustic waves on the piezoelectric substrate 100, or vice versa.

The SAW resonator according to an embodiment of the present invention is characterized by a capacitive reflector as a reflector having a function of a capacitor that improves a structure of a reflector used in the conventional SAW resonator and moves a parallel resonance frequency on a response curve toward a series resonance frequency to realize steep skirt characteristics. The SAW resonator according to an embodiment of the present invention includes slit reflectors 300 and 400 that form slit capacitance in the reflector as a specific example of such a capacitive reflector.

The slit reflector may basically function as a conventional reflector, and is disposed on the piezoelectric substrate 100 in the propagation direction of the surface acoustic waves generated by the IDT electrode 200 to reflect the surface acoustic waves to the IDT electrode 200, respectively.

The IDT electrode 200 is a comb structure in which a plurality of metal electrodes, i.e., a plurality of fingers are arranged in parallel, and includes an input IDT electrode unit 210 having a plurality of input IDT fingers 212 and an output IDT electrode unit 220 having a plurality of output IDT fingers 222.

The IDT electrode 200 is configured that each of the input IDT fingers 212 and Each of the output IDT fingers 222 are alternately arranged. When an electric signal is applied through the input IDT electrode unit 210, a surface acoustic wave is generated on the piezoelectric substrate 100 due to an electric field between a plurality of input IDT fingers 212 and the output IDT finger 222, and the generated surface acoustic wave may be converted back into an electric signal and output through the output IDT electrode unit 220.

At this time, the surface acoustic waves generated in the IDT electrode 200 propagate in both directions, that is, in the left and right directions in the drawing, respectively.

Since the slit reflectors 300 and 400 as described above are disposed in the propagation direction of the surface acoustic wave generated in the IDT electrode 200, it is preferable that the slit reflectors 300 and 400 are provided at one end side and the other end side of the IDT electrode 200, respectively.

The slit reflectors 300 and 400 are disposed in the propagation direction of the acoustic wave generated by the IDT electrode 200 to reflect the propagated acoustic wave to the IDT electrode 200, respectively, and form slit capacitance, which is a slit structure that functions as a capacitance function.

That is, the slit reflectors 300 and 400 may include a plurality of divided reflection units 310 and 320, and 410 and 420 arranged in parallel in the direction perpendicular to the propagation direction of the acoustic waves generated by the IDT electrode 200, and slit capacitance provided by separating each of the divided reflection units to form at least one slit 301 or 401 and connecting power 600 to one divided reflection unit 310 or 410 of the slit 301 or 401 and the other divided reflection unit 320 or 420 of the slit 301 or 401, respectively.

Wherein each divided reflection unit 310, etc. includes a plurality of reflecting electrodes 312, etc. each of which has a length shorter than the length of the IDT fingers 212 and 222 of the IDT electrode 200, and which are arranged at preset intervals along the propagation direction of the acoustic waves from the IDT electrode 200.

In addition, each divided reflection unit 310, etc. is configured not to generate an acoustic wave by configuring the plurality of the reflecting electrodes in a closed form, as shown in FIG. 3.

Since power is connected to implement slit capacitance between the divided reflection units, if each divided reflection unit has an opened form, each divided reflection unit may generate an acoustic wave, which may change the characteristics of the acoustic wave generated by the IDT electrode 200.

However, because an acoustic wave generated by the divided reflection unit having an opened form may have completely different characteristics, such as the acoustic wave generated by the IDT electrode and the resonance frequency, it may adversely affect the characteristics of the acoustic wave generated by the IDT electrode.

Therefore, as shown in FIG. 3, it is preferable not to generate an acoustic wave by configuring each divided reflection unit 310, etc. in a closed form.

In addition, each divided reflection unit 310, etc. is preferably arranged in parallel so that a slit is formed between the lower end of the one divided reflection unit and the upper end of the other divided reflection unit, as shown in FIG. 3.

If the side of the one divided reflection unit and the facing side of another divided reflection unit are arranged to be spaced apart, it is undesirable because an acoustic wave can be generated between the two opposite divided reflection units even if the two divided reflection units are each in a closed form.

As shown in FIG. 3, the acoustic wave element according to an embodiment of the present invention may include an input-side connecting part 230 for connecting an input part 630 of a power source to the input IDT electrode unit 210 and a first divided reflection unit 310, respectively, and an output-side connecting part 240 for connecting an output part 640 of the power source to the output IDT electrode unit 220 and a second divided reflection unit 320. The input-side connecting part 230 may be configured to connect input power to both the input IDT electrode unit 210 and the divided reflection units 310 and 410 on both sides thereof, and the output-side connecting part 240 may be configured to connect output power to both the output IDT electrode unit 220 and the divided reflection units 320 and 420 on both sides thereof.

As shown in FIG. 3, in the one-side of the slit reflector 300, a first divided reflection unit 310 and a second divided reflection unit 320 are arranged in parallel in a direction perpendicular to the propagation direction of the surface acoustic wave (vertical direction in the drawing), and a slit 301 is formed by a gap between the first and the second divided reflection units, and when the input part 630 of the power source 600 is connected to the first divided reflection unit 310 and the output part 640 is connected to the second divided reflection unit 320 to apply current, an electric potential difference occurs between the first divided reflection unit 310 of the input power source and the second divided reflection unit 320 of the output power source, and accordingly, the slit 301 is filled with electric charges to become slit capacitance that functions as a capacitor.

The configuration of the one-side slit reflector 300 is equally applied to the other-side slit reflector 400. That is, the configurations referred to by reference numerals 310, 320, and 301 respectively for the one-side slit reflector 300 correspond to the configurations referred to by reference numerals 410, 420, and 401 respectively for the other-side slit reflector 400.

Figure 2:
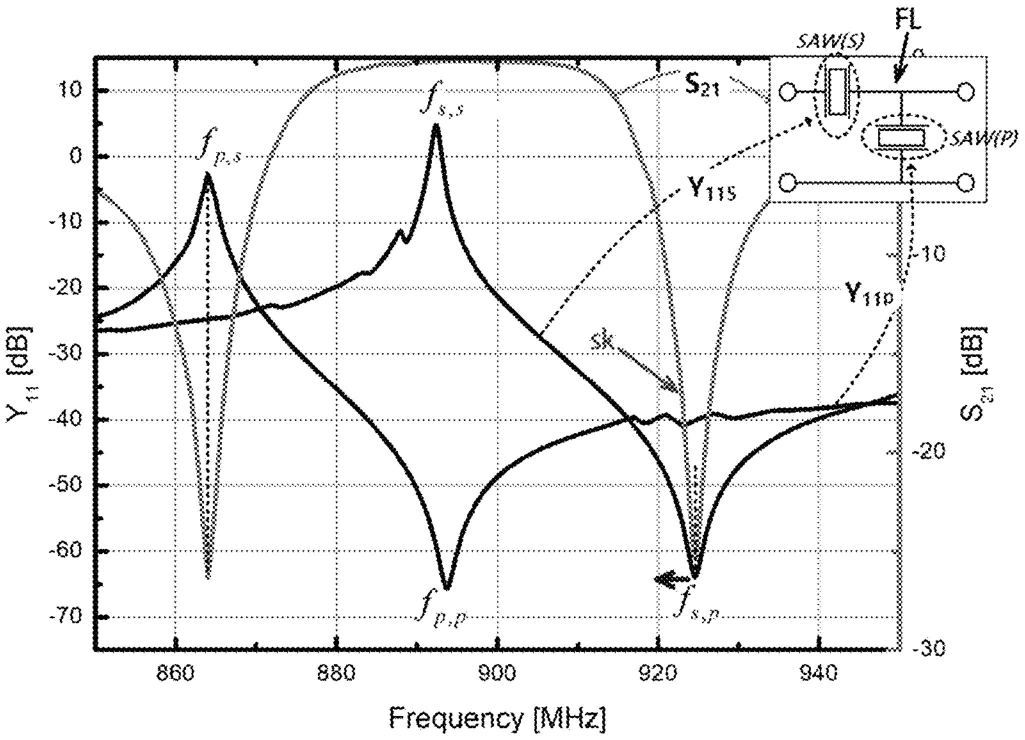
FIG. 2 shows a response curve of a basic SAW passband filter having a series SAW resonator and a parallel SAW resonator according to the conventional configuration of the SAW resonator.

As shown in FIG. 2, the series resonance frequency and parallel resonance frequency of the SAW resonator constituting the filter are very important design variables that determine the passband and stop band of the filter.

Figure 1:
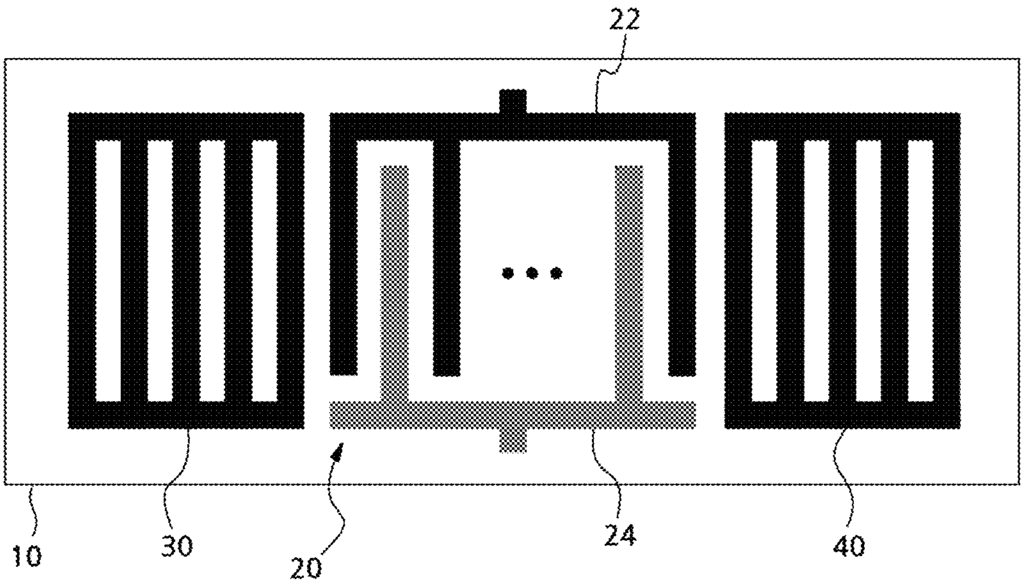
FIG. 1 shows a conventional configuration of a SAW resonator having a conventional reflector structure.

As can be seen from the equivalent circuit model of a conventional SAW resonator as shown in FIG. 1 shown in FIG. 4A, both series resonance and parallel resonance exist at the same time in the SAW resonator, and the series resonance frequency and the parallel resonance frequency at this time are expressed by Equation 1 below.

$$f_s = \frac{1}{2\pi\sqrt{L_m C_m}},\ f_p = \frac{1}{2\pi}\left(\sqrt{\frac{1}{L_m C_m}\cdot\left(1+\frac{C_m}{C_0}\right)}\right) \qquad \text{[Equation 1]}$$

Wherein, fs and fp refer to the series resonance frequency fs and parallel resonance frequency fp determined through the equivalent circuit model of the conventional SAW resonator shown in FIG. 4A.

The series resonance frequency and the parallel resonance frequency are determined by the electromechanical coupling coefficient of the piezoelectric substrate of the SAW resonator. In order to improve the skirt characteristics of the filter, the difference between the series resonance frequency and the parallel resonance frequency must be reduced, and conventionally, a method of connecting a passive capacitor element in parallel to the conventional SAW resonator was used.

However, in such a case, there is a problem of cost and size increase due to the addition of passive elements, so in order to solve this problem, the present invention proposes a configuration with the slit reflector implementing slit capacitance as described above. FIG. 4B shows an equivalent circuit model of the SAW resonator with the slit reflector as shown in FIG. 3.

The series resonance frequency and parallel resonance frequency according to the equivalent circuit model of the SAW resonator with the above-described slit reflector can be expressed by Equation 2 below.

$$f_s = \frac{1}{2\pi\sqrt{L_m C_m}},\ f_{pc} = \frac{1}{2\pi}\left(\sqrt{\frac{1}{L_m C_m}\cdot\left(1+\frac{C_m}{C_0+C_{slit}}\right)}\right) \quad \text{[Equation 2]}$$

Wherein, fs and fpc are the series resonance frequency fs and the parallel resonance frequency fpc determined by the equivalent circuit model of the SAW resonator with the slit reflector shown in FIG. 4B.

FIG. 5 shows a comparison between an admittance response curve of the conventional SAW resonator with the conventional reflector and an admittance response curve of the SAW resonator with the slit reflector according to an embodiment of the present invention.

The Ccon curve illustrated as a solid line in FIG. 5 is the admittance response curve of the conventional SAW resonator with the conventional reflector, and the Cinv curve illustrated as a dotted line in FIG. 5 is the admittance response curve of the SAW resonator with the slit reflector according to an embodiment of the present invention.

As shown in FIG. 5, there is no change in the series resonance frequency as the conventional reflector is substituted to the slit reflector, but the parallel resonance frequency fp on the curve of the resonator with the conventional reflector has shifted to the parallel resonance frequency fpc due to the effect of the slit capacitance of the slit reflector.

In other words, as shown in the graph of FIG. 5, it can be seen that the admittance response of the SAW resonator with the slit reflector can achieve the same effect as that of a passive capacitor connected in parallel to the conventional SAW resonator.

As shown in FIG. 3, if a width Ws of the slits 301 and 401 formed between the first divided reflection unit and the second divided reflection unit of the slit reflectors 300 and 400 of the acoustic wave element according to an embodiment of the present invention is large, the surface acoustic waves generated from the IDT electrode may leak through the slit. Accordingly, the width Ws of the slit formed between the first divided reflection unit and the second divided reflection unit is preferably formed to be shorter than a wavelength of the surface acoustic wave generated from the IDT electrode 200, and thus, leakage of the surface acoustic waves through the slit may be prevented. That is, it is preferable that (the width Ws of the slit)<(the wavelength of the surface acoustic wave from IDT).

Meanwhile, as shown in FIG. 3, the length Ls of the slit 301 or 401 formed between the two divided reflection units are related to a capacitance value. That is, the longer the length Ls of the slit, the greater the capacitance capacity.

In addition, the embodiment shown in FIG. 3 is a case in which each slit reflector has a structure in which one slit is formed between the first divided reflection unit and the second divided reflection unit separated from each other. Furthermore, the structure of the reflector may be changed for two or more slits to be formed so that a plurality of slit capacitances may be provided, and the slit reflector having the plurality of slit capacitances may obtain the same effect as connecting a plurality of passive capacitors to the IDT electrode in series or in parallel.

Accordingly, the slit reflector of the acoustic wave element according to the present invention is characterized in that the capacitance value of the slit capacitance can be adjusted by designing the length of the slit and/or the number of the slit formed by a plurality of the divided reflection units.

Examples in which two or more slits are formed are shown in FIGS. 6 and 7, respectively.

The SAW resonator with the slit reflector of one-slit structure shown in FIG. 3, the SAW resonator with the slit reflector of two-slit structure shown in FIG. 6, and the SAW resonator with the slit reflector of three-slit structure shown in FIG. 7 differ in the structure of the slit reflector and the power connection structure, respectively, and other configurations are substantially the same. Hereinafter, descriptions of the same configurations will be omitted in each embodiment below.

In an embodiment shown in FIG. 6, the slit reflector 300 includes a first divided reflection unit 330, a second divided reflection unit 340, and a third divided reflection unit 350 which are disposed in parallel in a direction perpendicular to the propagation direction of the surface acoustic wave of the IDT electrode 200. A first slit 302 having a width smaller than a wavelength of the surface acoustic wave of the IDT electrode may be formed between the first divided reflection unit 330 and the second divided reflection unit 340, and a second slit 303 having a width smaller than a wavelength of the surface acoustic wave of the IDT electrode may be formed between the second divided reflection unit 340 and the third divided reflection unit 350.

Wherein one divided reflection unit and the other one divided reflection unit forming each of the slits 302 and 303 need power connections having different polarities. As shown in FIG. 6, the input-side connecting part 250 connected to the input part 630 of the power source is connected to the input IDT electrode unit 210, the first divided reflection unit 330 and the third divided reflection unit 350, and the output-side connecting part 260 connected to the output part 640 of the power source may be connected to the output IDT electrode unit 220 and the second divided reflection unit 340.

Accordingly, the first slit 302 may serve as slit capacitance due to an electric potential difference between the first divided reflection unit 330 of the input power source and the second divided reflection unit 340 of the output power source, and the second slit 303 may serve as slit capacitance due to an electric potential difference between the third divided reflection unit 350 of the input power source and the second divided reflection unit 340 of the output power source.

In each of the divided reflection units 330, etc., a plurality of reflecting electrodes having a length shorter than the length of the IDT fingers of the IDT electrode 200 are arranged parallel to each other at preset intervals along the propagation direction of the acoustic wave from the IDT electrode 200. Wherein it is preferable that the divided reflection unit connected to the power source does not generate an acoustic wave by configuring the plurality of reflecting electrodes in a closed form.

Furthermore, it is preferable that the longitudinal direction of the slit is perpendicular to the longitudinal direction of the reflecting electrodes of each of the two divided reflection units forming the slit. That is, referring to the illustration of the drawing, it is preferable that the slit is arranged in parallel so that the slit is formed between the lower end of one divided reflection unit and the upper end of the other divided reflection unit.

The configuration of the one-side slit reflector 300 is equally applied to the other-side slit reflector 400. That is, the configurations referred to by reference numerals 330, 340, 350, 302 and 303 respectively for the one-side slit reflector 300 correspond to the configurations referred to by reference numerals 430, 440, 450, 402 and 403 respectively for the other-side slit reflector 400.

According to the above-described configuration, the SAW resonator according to the embodiment shown in FIG. 6 may implement a slit reflector having slit capacitance by two slits.

Meanwhile, in an embodiment shown in FIG. 7, the slit reflector 300 includes a first divided reflection unit 360, a second divided reflection unit 370, a third divided reflection unit 380, and a fourth divided reflection unit 390 which are disposed in parallel in a direction perpendicular to the propagation direction of the surface acoustic wave of the IDT electrode 200. A first slit 304 having a width smaller than a wavelength of the surface acoustic wave of the IDT electrode may be formed between the first divided reflection unit 360 and the second divided reflection unit 370, a second slit 305 having a width smaller than the wavelength of the surface acoustic wave of the IDT electrode may be formed between the second divided reflection unit 370 and the third divided reflection unit 380, and a third slit 306 having a width smaller than the wavelength of the surface acoustic wave of the IDT electrode may be formed between the third divided reflection unit 380 and the fourth divided reflection unit 390.

Wherein one divided reflection unit and the other one divided reflection unit forming each of the slits 304, 305 and 306 need power connections having different polarities. As shown in FIG. 7, the input-side connecting part 270 connected to the input part 630 of the power source is connected to the input IDT electrode unit 210, the first divided reflection unit 360 and the third divided reflection unit 380, and the output-side connecting part 280 connected to the output part 640 of the power source may be connected to the output IDT electrode unit 220, the second divided reflection unit 370 and the fourth divided reflection unit 390.

Accordingly, the first slit 304 may serve as slit capacitance due to an electric potential difference between the first divided reflection unit 360 of the input power source and the second divided reflection unit 370 of the output power source, and the second slit 305 may serve as slit capacitance due to an electric potential difference between the third divided reflection unit 380 of the input power source and the second divided reflection unit 370 of the output power source, and the third slit 306 may serve as slit capacitance due to an electric potential difference between the third divided reflection unit 380 of the input power source and the fourth divided reflection unit 390 of the output power source.

In each of the divided reflection units 360, etc., a plurality of reflecting electrodes having a length shorter than the length of the IDT fingers of the IDT electrode 200 are arranged parallel to each other at preset intervals along the propagation direction of the acoustic wave from the IDT electrode 200. Wherein it is preferable that the divided reflection unit connected to the power source does not generate an acoustic wave by configuring the plurality of reflecting electrodes in a closed form.

Furthermore, it is preferable that the longitudinal direction of the slit is perpendicular to the longitudinal direction of the reflecting electrodes of each of the two divided reflection units forming the slit. That is, referring to the illustration of the drawing, it is preferable that the slit is arranged in parallel so that the slit is formed between the lower end of one divided reflection unit and the upper end of the other divided reflection unit.

The configuration of the one-side slit reflector 300 is equally applied to the other-side slit reflector 400. That is, the configurations referred to by reference numerals 360, 370, 380, 390, 304, 305 and 306 respectively for the one-side slit reflector 300 correspond to the configurations referred to by reference numerals 460, 470, 480, 490, 404, 405 and 406 respectively for the other-side slit reflector 400.

According to the above-described configuration, the SAW resonator according to the embodiment shown in FIG. 7 may implement a slit reflector having slit capacitance by three slits.

As described above, FIG. 8 shows an admittance response curve of the SAW resonator having one-slit structure (see FIG. 3), an admittance response curve of the SAW resonator having two-slit structure (see FIG. 6), and an admittance response curve of the SAW resonator having three-slit structure (see FIG. 7).

Figure 8:
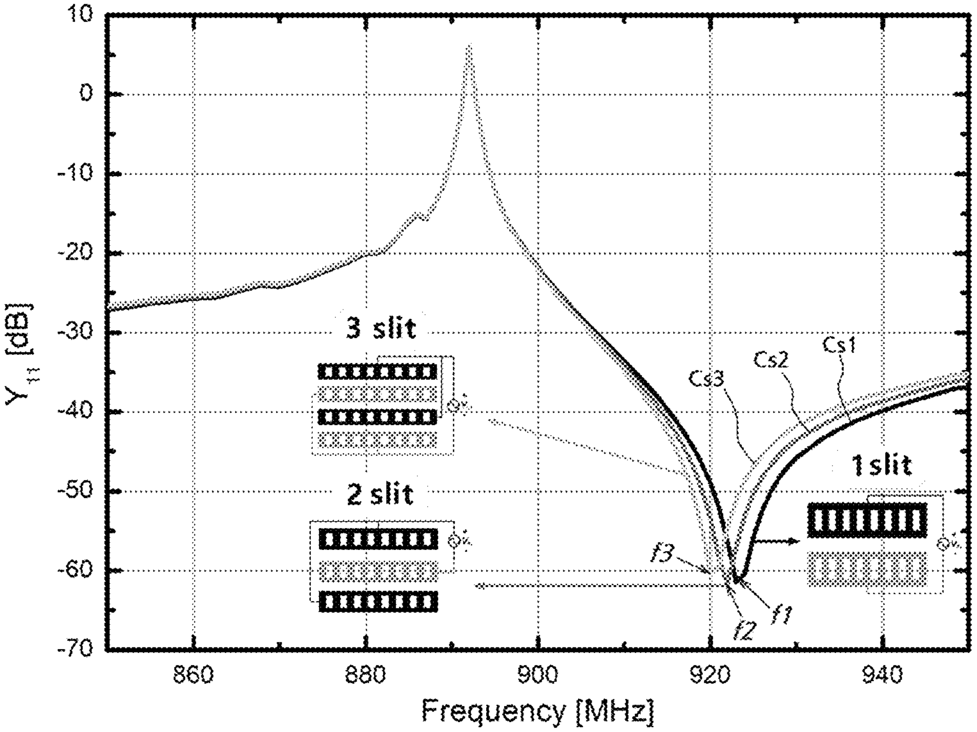
FIG. 8 shows admittance response curves of each SAW resonator having a slit reflector with 1-slit structure, a slit reflector with 2-slit structure, and a slit reflector with three-slit structure, respectively, as shown in FIGS. 3, 6, and 7.

In FIG. 8, the Cs1 curve represents the response curve for the SAW resonator of the one-slit reflector, the Cs2 curve represents the response curve for the SAW resonator of the two-slit reflector, and the Cs3 curve represents the response curve for the SAW resonator of the three-slit reflector.

In addition, f1 indicates a parallel resonance frequency of the SAW resonator of the one-slit reflector, f2 indicates a parallel resonance frequency of the SAW resonator of the two-slit reflector, and f3 indicates a parallel resonance frequency of the SAW resonator of the three-slit reflector.

As shown in FIG. 8, it can be seen that the parallel resonance frequency moves toward the series resonance frequency at f1→f2→f3 as it goes to 1 slit→2 slit→3 slit.

Using the above stated characteristics, a capacitance value of the slit capacitance may be adjusted by adjusting the number of slits of the slit reflector, thereby obtaining the desired movement effect of the parallel resonance frequency. (As described above, as the parallel resonance frequency moves closer to the series resonance frequency, steeper skirt characteristics may be obtained from the response curve of the SAW filter).

Meanwhile, an acoustic wave element including a reflector having a capacitance function according to another embodiment of the present invention will be described with reference to FIG. 9.

Figure 9A:
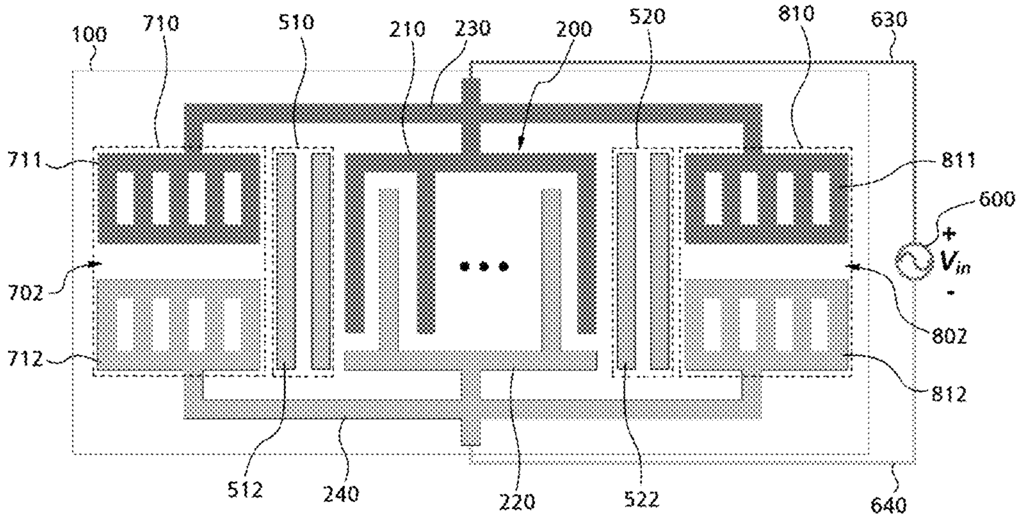
FIG. 9A and FIG. 9B show examples of an acoustic wave element having slit reflector structures for improving the skirt characteristics of a SAW passband filter according to another embodiment of the present invention.
Figure 9B:
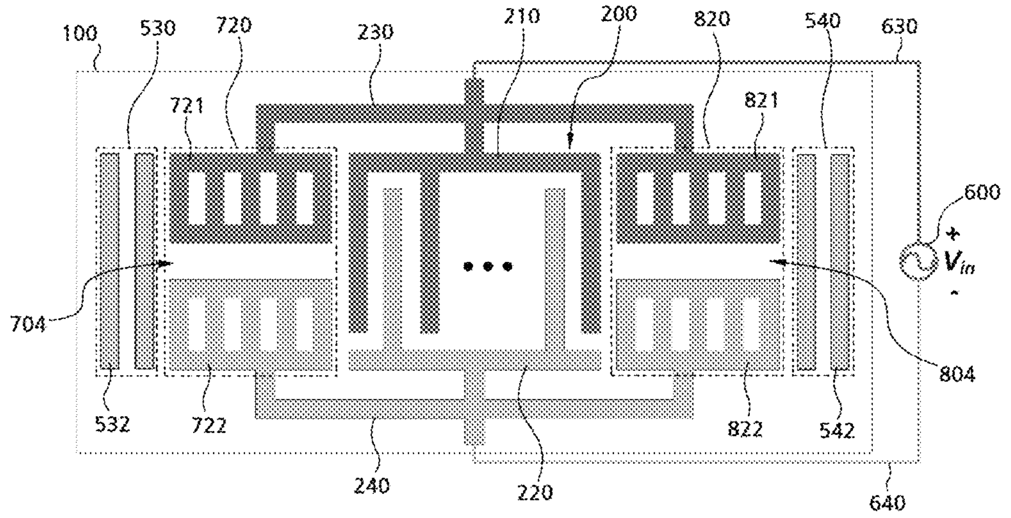

FIG. 9A shows an example of implementing a slit reflector and a plurality of floating reflectors provided in front of the slit reflector, and FIG. 9B shows an example of implementing a slit reflector and a plurality of floating reflectors provided behind the slit reflector.

The SAW resonator according to the embodiment shown in FIG. 9A may be configured to include slit reflectors 710 and 810 on both sides of the IDT electrode 200, and front reflectors 510 and 520 (the plurality of the floating reflectors) between the IDT electrode 200 and the slit reflectors 710 and 810, respectively.

As shown in FIG. 9A, in the slit reflector 710, a first divided reflection unit 711 and a second divided reflection unit 712 are arranged in parallel in a direction perpendicular to the propagation direction of the surface acoustic wave (vertical direction in the drawing), and a slit 702 is formed by a gap between the first and the second divided reflection units, and when the input part 630 of the power source 600 is connected to the first divided reflection unit 711 and the output part 640 is connected to the second divided reflection unit 712 to apply current, an electric potential difference occurs between the first divided reflection unit 711 of the input power source and the second divided reflection unit 712 of the output power source, and accordingly, the slit 702 is filled with electric charges to become slit capacitance that functions as a capacitor.

Wherein a plurality of the floating reflectors 510 including one or more metal electrodes 512 may be provided between the slit reflector 710 and the IDT electrode 200 (in front of the slit reflector 710) without power connection.

Accordingly, the surface acoustic wave generated from the IDT electrode 200 is first reflected by the plurality of floating reflectors 510, and the rest is reflected by the slit reflector 710.

As described above, the plurality of the floating reflectors 510 are provided between the slit reflector and the IDT electrode without power connection to perform a normal reflector function and obtain the effect of slit capacitance by the slit reflector 710.

The configurations of the one-side slit reflector 710 and the floating reflectors 510 provided between the IDT electrode and the one-side slit reflector 710 are equally applied to the other-side slit reflector 810 and the floating reflectors 520. That is, the configurations referred to by reference numerals 711, 712 and 702 respectively for the one-side slit reflector 710 correspond to the configurations referred to by reference numerals 811, 812 and 802 respectively for the other-side slit reflector 810, and the configuration of the one-side floating reflectors 510 correspond to the configuration of the other-side floating reflectors 520.

Meanwhile, the SAW resonator according to the embodiment shown in FIG. 9B may be configured to include slit reflectors 720 and 820 on both sides of the IDT electrode 200, and behind reflectors 530 and 540 (the plurality of the floating reflectors) behind the slit reflectors 720 and 820, respectively.

As shown in FIG. 9B, in the slit reflector 720, a first divided reflection unit 721 and a second divided reflection unit 722 are arranged in parallel in a direction perpendicular to the propagation direction of the surface acoustic wave (vertical direction in the drawing), and a slit 704 is formed by a gap between the first and the second divided reflection units, and when the input part 630 of the power source 600 is connected to the first divided reflection unit 721 and the output part 640 is connected to the second divided reflection unit 722 to apply current, an electric potential difference occurs between the first divided reflection unit 721 of the input power source and the second divided reflection unit 722 of the output power source, and accordingly, the slit 704 is filled with electric charges to become slit capacitance that functions as a capacitor.

Wherein a plurality of the floating reflectors 530 including one or more metal electrodes 532 may be provided behind the slit reflector 720 without power connection.

Accordingly, the surface acoustic wave generated from the IDT electrode 200 is first reflected by the slit reflector 720, and the rest is reflected by the plurality of the floating reflectors 530.

As described above, the plurality of the floating reflectors 530 are provided behind the slit reflector without power connection to perform a normal reflector function and obtain the effect of slit capacitance by the slit reflector 720.

The configurations of the one-side slit reflector 720 and the floating reflectors 510 provided behind the one-side slit reflector 720 are equally applied to the other-side slit reflector 820 and the floating reflectors 540. That is, the configurations referred to by reference numerals 721, 722 and 704 respectively for the one-side slit reflector 720 correspond to the configurations referred to by reference numerals 821, 822 and 804 respectively for the other-side slit reflector 820, and the configuration of the one-side floating reflectors 530 correspond to the configuration of the other-side floating reflectors 540.

As described above, the length of the slit formed in the slit reflector may be adjusted through a configuration including the slit reflector and a plurality of floating reflectors, and accordingly, a capacitance value of the slit capacitance by the slit reflector may be adjusted.

Figure 10:
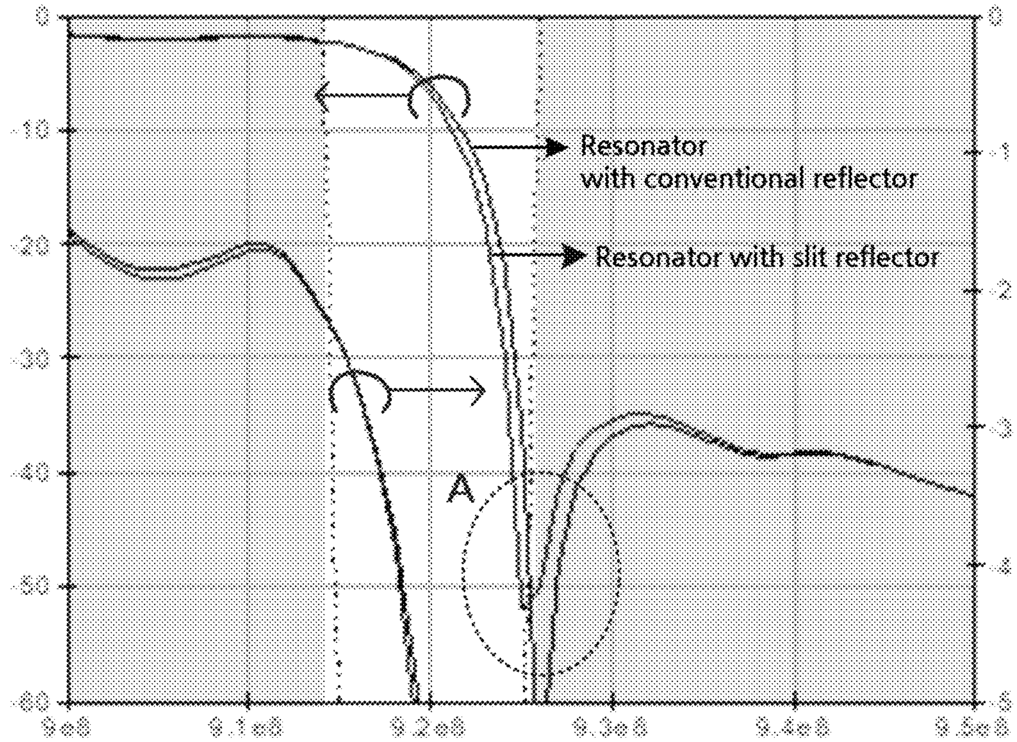
FIG. 10 is a graph comparing the response curve of a SAW filter configured with a conventional SAW resonator having a conventional reflector and the response curve of a SAW filter configured with a SAW resonator having a slit reflector according to an embodiment of the present invention.

Meanwhile, FIG. 10 is a graph comparing the response curve of a SAW filter configured with a conventional SAW resonator having a conventional reflector and the response curve of a SAW filter configured with a SAW resonator having a slit reflector as described above according to an embodiment of the present invention.

Referring to the portion indicated by A in the graph of FIG. 10, it may be seen that the SAW filter composed of the SAW resonator with the slit reflector has a steeper change in skirt characteristics compared to the conventional filter. In this way, the blocking effect in the counter band may be maximized by improving the skirt characteristics of the filter by using the slit reflector.

This steep skirt characteristics is influenced by the slit reflector as described above, and the desired skirt characteristics can be obtained by adjusting the length of the slit in the slit reflector and the number of the slit in the slit reflector as described above.

Figure 11:
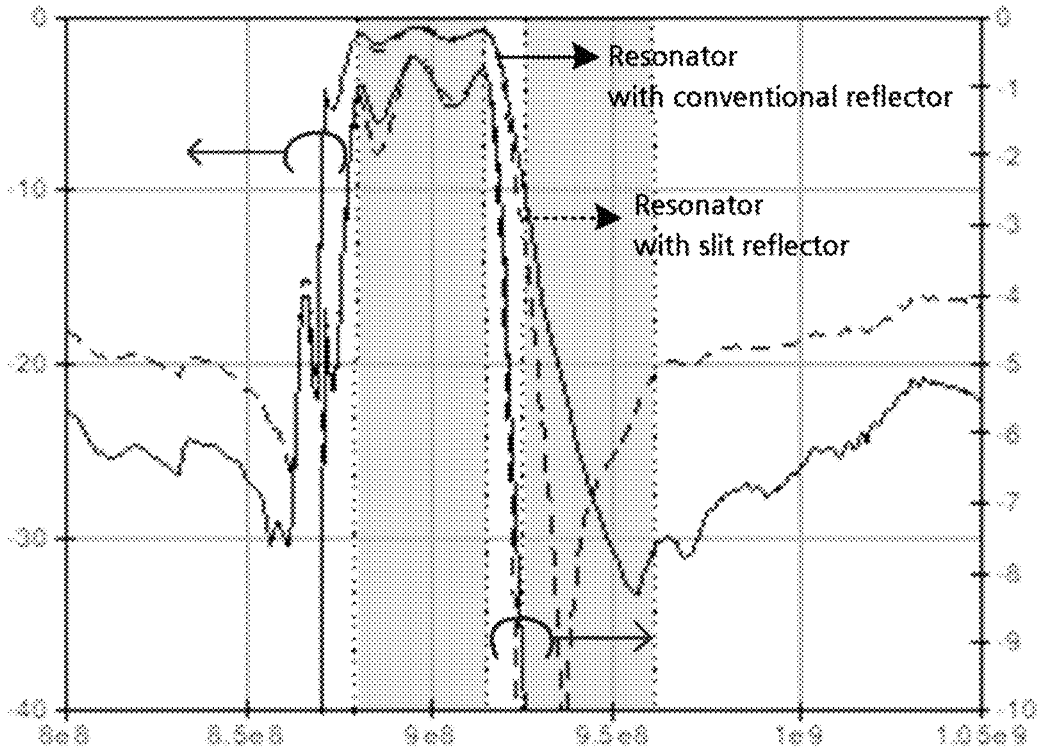
FIG. 11 is a graph comparing the results of applying a slit reflector according to an embodiment of the present invention to a DMS (Double Mode SAW) type SAW passband filter with a conventional filter.

FIG. 11 is a graph comparing the results of applying a slit reflector according to an embodiment of the present invention to a DMS (Double Mode SAW) type SAW passband filter with a conventional filter. In FIG. 11, the solid line represents the filter response curve by the conventional resonator with the conventional reflector, and the dotted line represents the filter response curve by the resonator with the slit reflector.

As shown in FIG. 11, it can be seen that the right blocking effect of the pass band can be improved for the SAW pass filter in the form of DMS by using the SAW resonator with the slit reflector as described above.

In the SAW resonator with the capacitive reflector structure according to the present invention, the position of the slit capacitance in the slit reflector may be freely disposed within an allowed range, the slit may be implemented in a curved shape as well as a straight shape, and the slit may be configured to be formed in various directions. As described above, a slit reflector may be designed such that the capacitance value is adjusted to a desired specification using various types of slit capacitance.

As described above, the acoustic wave element having reflectors providing capacitance according to the present invention has an effect that the skirt characteristics of the acoustic wave element can be further improved by configuring the reflector structure of the acoustic wave element such as a SAW resonator, a composite resonator, and DMS as a capacitive reflector structure so that the parallel resonance frequency can be shifted toward the series resonance frequency without additional capacitors connected to the acoustic wave element while maintaining the area. Furthermore, it is possible to obtain improved skirt characteristics according to desired design specifications by freely designing the length, number, shape, direction, and position of slits of the slit reflector and adjusting the capacitance value.

What is claimed is:

1. An acoustic wave element providing a reflector having a capacitance function comprising:

a piezoelectric substrate;

an IDT electrode provided on the piezoelectric substrate to convert electric signals into acoustic waves on the piezoelectric substrate and convert the acoustic waves into electric signals; and a slit reflector that is placed in the propagation direction of the acoustic wave generated from the IDT electrode to reflect the acoustic wave to the IDT electrode, and forms slit capacitance, a slit structure that functions as capacitance, wherein the slit reflector includes a plurality of divided reflection units each of which reflects the acoustic wave generated by the IDT electrode to the IDT electrode, and at least one slit, wherein the plurality of the divided reflection units are arranged in parallel in a direction perpendicular to the propagation direction of the acoustic wave generated by the IDT electrode, the at least one slit is formed by being spaced apart from each of the plurality of divided reflection units, and the slit is configured to function as the slit capacitance by connecting power to one divided reflection unit and the other divided reflection unit of the slit, respectively, and wherein the slit reflector is configured so that a width of the slit formed between each of the plurality of the divided reflection units is shorter than a wavelength of the acoustic wave generated from the IDT electrode.

2. The acoustic wave element according to claim 1, further comprising a plurality of floating reflectors provided behind the slit reflector without a power connection to reflect the acoustic waves propagating from the IDT electrode in front of the slit reflector, wherein each of the plurality of floating reflectors is disposed at predetermined intervals along the propagation direction of the acoustic wave generated by the IDT electrode.

3. The acoustic wave element according to claim 1, wherein the IDT electrode includes an input IDT electrode unit having a plurality of input IDT fingers and an output IDT electrode unit having a plurality of output IDT fingers, and wherein the slit reflector includes:

a plurality of divided reflection units arranged in parallel in a direction perpendicular to the propagation direction of the acoustic wave generated by the IDT electrode;

at least one slit provided between the divided reflection units;

an input-side connection unit connecting the input part of a power source to the input IDT electrode unit and the divided reflection unit on one side of the slit, respectively; and an output-side connection unit connecting the output part of the power source to the output IDT electrode unit and the divided reflection unit on the other side of the slit, respectively.

4. The acoustic wave element according to claim 1, wherein the slit reflector includes:

a first divided reflection unit, a second divided reflection unit, and a third divided reflection unit arranged in parallel in a direction perpendicular to the propagation direction of the acoustic wave generated by the IDT electrode;

a first slit with a width smaller than a wavelength of the acoustic wave between the first divided reflection unit and the second divided reflection unit; and a second slit with a width smaller than the wavelength of the acoustic wave between the second divided reflection unit and the third divided reflection unit, and wherein the slit capacitance includes a capacitance by the first slit between the first divided reflection unit and the second divided reflection unit, and a capacitance by the second slit between the second divided reflection unit and the third divided reflection unit, by connecting an input part of a power source to the first divided reflection unit, and the third divided reflection unit and an output part of the power source to the second divided reflection unit.

5. The acoustic wave element according to claim 1, wherein the slit reflector includes:

a first divided reflection unit, a second divided reflection unit, a third divided reflection unit and a fourth divided reflection unit arranged in parallel in a direction perpendicular to the propagation direction of the acoustic wave generated by the IDT electrode;

a first slit with a width smaller than a wavelength of the acoustic wave between the first divided reflection unit and the second divided reflection unit;

a second slit with a width smaller than the wavelength of the acoustic wave between the second divided reflection unit and the third divided reflection unit;

a third slit with a width smaller than the wavelength of the acoustic wave between the third divided reflection unit and the fourth divided reflection unit, and wherein the slit capacitance includes a capacitance by the first slit between the first divided reflection unit and the second divided reflection unit, a capacitance by the second slit between the second divided reflection unit and the third divided reflection unit, and a capacitance by the third slit between the third divided reflection unit and the fourth divided reflection unit, by connecting an input part of a power source to the first divided reflection unit and the third divided reflection unit, and an output part of the power source to the second divided reflection unit and the fourth divided reflection unit.

6. An acoustic wave element providing a reflector having a capacitance function comprising:

a piezoelectric substrate;

an IDT electrode provided on the piezoelectric substrate to convert electric signals into acoustic waves on the piezoelectric substrate and convert the acoustic waves into electric signals; and a slit reflector that is placed in the propagation direction of the acoustic wave generated from the IDT electrode to reflect the acoustic wave to the IDT electrode, and forms slit capacitance, a slit structure that functions as capacitance, wherein the slit reflector includes a plurality of divided reflection units each of which reflects the acoustic wave generated by the IDT electrode to the IDT electrode, and at least one slit, wherein the plurality of the divided reflection units are arranged in parallel in a direction perpendicular to the propagation direction of the acoustic wave generated by the IDT electrode, the at least one slit is formed by being spaced apart from each of the plurality of divided reflection units, and the slit is configured to function as the slit capacitance by connecting power to one divided reflection unit and the other divided reflection unit of the slit, respectively, and wherein the slit reflector has an adjusted capacitance value of the slit capacitance by adjusting a length of the slit formed by the plurality of divided reflection units and the number of the slit.

7. An acoustic wave element providing a reflector having a capacitance function comprising:

a piezoelectric substrate;

an IDT electrode provided on the piezoelectric substrate to convert electric signals into acoustic waves on the piezoelectric substrate and convert the acoustic waves into electric signals; and a slit reflector that is placed in the propagation direction of the acoustic wave generated from the IDT electrode to reflect the acoustic wave to the IDT electrode, and forms slit capacitance, a slit structure that functions as capacitance, wherein the slit reflector includes a plurality of divided reflection units each of which reflects the acoustic wave generated by the IDT electrode to the IDT electrode, and at least one slit, wherein the plurality of the divided reflection units are arranged in parallel in a direction perpendicular to the propagation direction of the acoustic wave generated by the IDT electrode, the at least one slit is formed by being spaced apart from each of the plurality of divided reflection units, and the slit is configured to function as the slit capacitance by connecting power to one divided reflection unit and the other divided reflection unit of the slit, respectively, and wherein each of the plurality of divided reflection units is configured to form a closed shape by arranging a plurality of reflecting electrodes having a length shorter than a length of IDT fingers of the IDT electrode at predetermined intervals along the propagation direction of the acoustic wave generated by the IDT electrode.

8. An acoustic wave element providing a reflector having a capacitance function comprising:

a piezoelectric substrate;

an IDT electrode provided on the piezoelectric substrate to convert electric signals into acoustic waves on the piezoelectric substrate and convert the acoustic waves into electric signals; and a slit reflector that is placed in the propagation direction of the acoustic wave generated from the IDT electrode to reflect the acoustic wave to the IDT electrode, and forms slit capacitance, a slit structure that functions as capacitance; and a plurality of floating reflectors provided between the IDT electrode and the slit reflector without a power connection to reflect the acoustic waves propagating from the IDT electrode in front of the slit reflector, wherein each of the plurality of floating reflectors is disposed at predetermined intervals along the propagation direction of the acoustic wave generated by the IDT electrode, wherein each of the plurality of divided reflection units of the slit reflector is configured to form a closed shape by arranging a plurality of reflecting electrodes with a length shorter than a length of IDT finger of the IDT electrode at predetermined intervals along the propagation direction of the acoustic wave generated by the IDT electrode, wherein each of the plurality of floating reflectors is configured to have the same length as the length from the upper end to the lower end of the IDT electrode.

* * * * *